(12) United States Patent
Kitano (10) Patent No.: US 10,742,177 B2
(45) Date of Patent: Aug. 11, 2020

(54) SIGNAL TRANSMISSION SYSTEM, TRANSMISSION DEVICE, AND COMMUNICATION UNIT

(71) Applicant: Yamaha Corporation, Hamamatsu-shi, Shizuoka-Ken (JP)

(72) Inventor: Mikio Kitano, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 16/654,070

(22) Filed: Oct. 16, 2019

(65) Prior Publication Data
US 2020/0127616 A1  Apr. 23, 2020

(30) Foreign Application Priority Data
Oct. 17, 2018  (JP) .................. 2018-195651

(51) Int. Cl.
*H03F 3/181* (2006.01)
*H04R 3/04* (2006.01)

(52) U.S. Cl.
CPC .............. *H03F 3/181* (2013.01); *H04R 3/04* (2013.01); *H03F 2200/03* (2013.01); *H03F 2200/165* (2013.01); *H03F 2200/171* (2013.01)

(58) Field of Classification Search
CPC ............... H03F 3/181; H03F 2200/03; H03F 2200/165; H03F 2200/171; H04R 3/04
See application file for complete search history.

(56) References Cited

U.S. PATENT DOCUMENTS 3,325,605 A * 6/1967 Brewer ............... H04B 17/403
370/243
5,790,526 A * 8/1998 Kniess ................. H04L 5/16
178/71.1

FOREIGN PATENT DOCUMENTS

JP          2010-86112 A      4/2010

* cited by examiner

*Primary Examiner* — Andrew L Sniezek
(74) *Attorney, Agent, or Firm* — Crowell & Moring LLP (57) ABSTRACT

A signal transmission includes a first transmission device that includes: a first output amplifier that outputs a first output signal; and a first impedance circuit that has one or a plurality of reactance element provided between the first output amplifier and a transmission line, where impedance of the first impedance circuit corresponds to frequencies belonging to a first band, and is smaller than impedance corresponding to frequencies outside the first band; and a second transmission device that includes: a second output amplifier that outputs a second output signal; and a second impedance circuit that has one or a plurality of reactance elements provided between the second output amplifier and the transmission line, where impedance of the second impedance circuit corresponds to frequencies belonging to a second band differing from the first band, and is smaller than impedance corresponding to frequencies outside the second band.

18 Claims, 5 Drawing Sheets

SIGNAL TRANSMISSION SYSTEM, TRANSMISSION DEVICE, AND COMMUNICATION UNIT

CROSS REFERENCE TO RELATED APPLICATIONS

This application is based on and claims priority from Japanese Patent Application No. 2018-195651, filed Oct. 17, 2018, the entire content of which is incorporated herein by reference.

TECHNICAL FIELD

The present disclosure relates to a signal transmission system, a transmission device, and a communication unit.

BACKGROUND

Japanese Patent Application Laid-Open Publication No. 2010-86112 discloses an automotive navigation system that includes an information providing device that synthesizes a low frequency sound signal and a high frequency data signal by use of a synthesizer, to output from a speaker sound derived from the synthesized signals; and a guide terminal that, based on the sound received by a microphone, reproduces the sound signal and the data signal.

In a conventional automotive navigation system, a high frequency signal and a low frequency signal are uni-directionally transmitted from an information processing device to a guide terminal, by synthesizing signals of different bands, and a sound is then output that corresponds to the synthesized signals. However, a drawback exists in the art in that it is not possible to transmit, for example, a high frequency signal in one direction and a low frequency signal in another opposing direction.

SUMMARY

Accordingly, one of objects according to aspects of the present disclosure is to provide a technique that enables dual-directional transmission of data signals of different bands.

To solve the above-described problem, a signal transmission system according to one aspect of the present disclosure includes: a first transmission device that includes: a first output amplifier configured to output a first output signal; and a first impedance circuit that has one or a plurality of reactance elements provided between the first output amplifier and a transmission line, where impedance of the first impedance circuit corresponds to frequencies belonging to a first band and is smaller than impedance corresponding to frequencies outside the first band; and a second transmission device that includes: a second output amplifier configured to output a second output signal; and a second impedance circuit that has one or a plurality of reactance elements provided between the second output amplifier and the transmission line, where impedance of the second impedance circuit corresponds to frequencies belonging to a second band differing from the first band and is smaller than impedance corresponding to frequencies outside the second band. In the first band, a value of a current flowing from the first output amplifier to the second output amplifier is equal to or less than a maximum output current value of the second output amplifier, and in the second band, a value of a current flowing from the second output amplifier to the first output amplifier is equal to or less than a maximum output current value of the first output amplifier.

DESCRIPTION OF THE EMBODIMENTS

1. First Embodiment 1-1. Overall Configuration of a Signal Transmission System 10

Figure 1A:
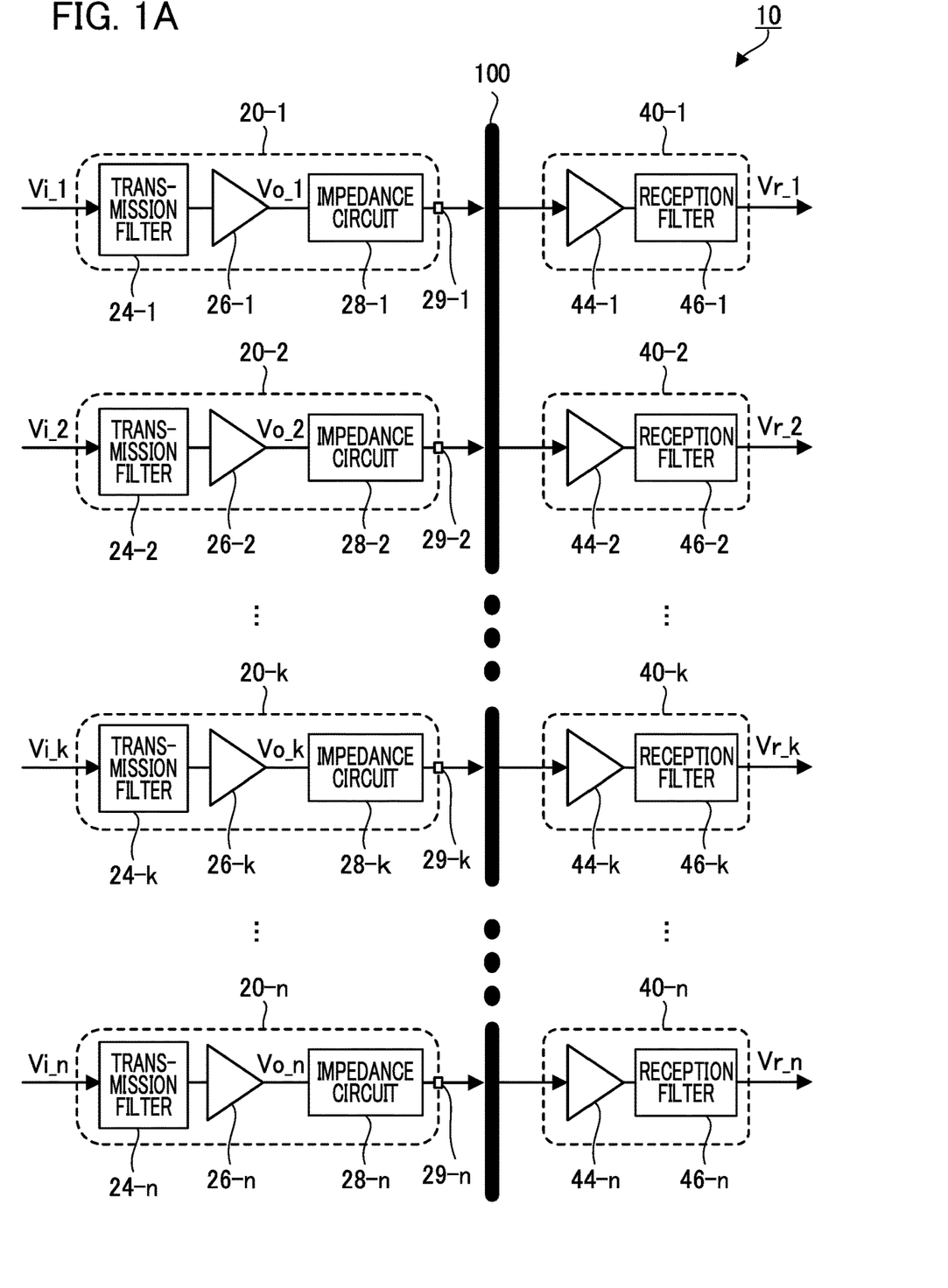
FIG. 1A is a block diagram illustrating an overall configuration of a signal transmission system 10 according to a first embodiment of the present disclosure.
Figure 1B:
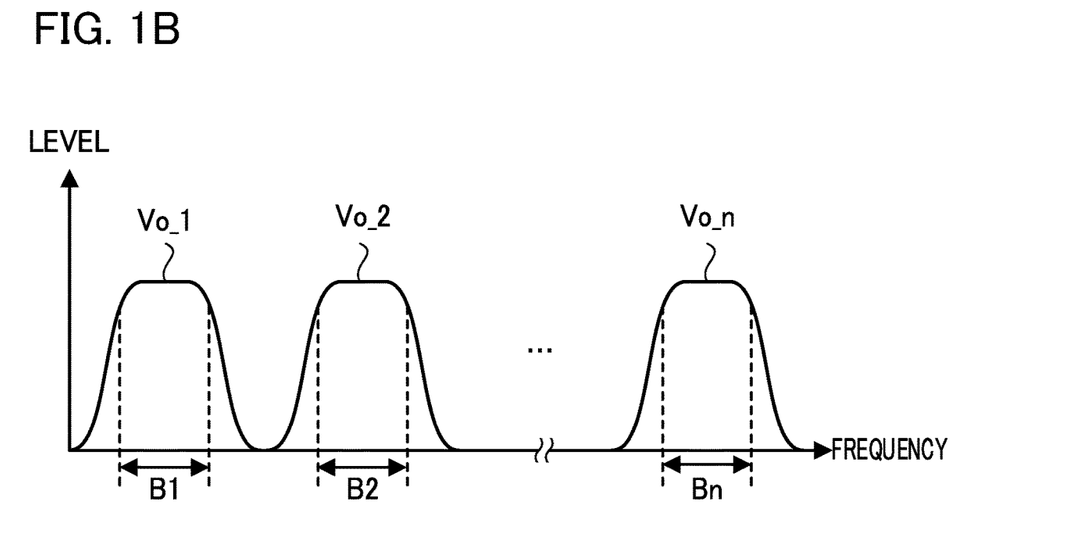
FIG. 1B is a graph showing an example of levels of different signals output by respective n transmission devices 20-1 to 20-n.

A first embodiment according to the present disclosure will now be described with reference to the drawings. FIG. 1A is a block diagram showing an overall configuration of a signal transmission system 10 according to a first embodiment of the present disclosure. The signal transmission system 10 has n transmission devices 20-1, 20-2, • • • 20-n, n reception devices 40-1, 40-2, • • • 40-n, and a transmission line 100, where n is a natural number that is 2 or more. In the signal transmission system 10, n transmission devices 20-1 to 20-n each output to the transmission line 100 signals having frequency components in different corresponding bands. FIG. 1B shows an example of levels (or amplitudes) of different signals output by the respective n transmission devices 20-1 to 20-n. As shown in the figure, in the signal transmission system 10, output signals Vo_1 to Vo_n having frequency components respectively in n bands B1 to Bn are transmitted via the transmission line 100. An input impedance of the n reception devices 40-1 to 40-n is a high impedance, and is higher than impedance of the transmission line 100.

There will now be described a transmission device 20-k and a reception device 40-k, where k is a natural number that satisfies 1≤k≤n. The transmission device 20-k has a transmission filter 24-k, an output amplifier 26-k, an impedance circuit 28-k, and an output terminal 29-k. Supplied to the transmission filter 24-k is an input signal Vin. The transmission device 20-k outputs to the transmission line 100 a signal that has frequency components in a band Bk that are larger than frequency components outside the band Bk. A majority of the frequency components of this signal are in the band Bk. The transmission filter 24-k reduces, within an input signal Vi_k, frequency components outside the band Bk, to output a resultant signal to the output amplifier 26-k. Accordingly, in a case where the input signal Vi_k has frequency components in a band that is wider than the band Bk, frequency components outside the band Bk can be reduced in the input signal Vi_k. By use of the transmission filter 24-$k$, an influence of the input signal Vi_k on a signal having frequency components outside the band Bk can be minimized.

The output amplifier 26-$k$ generates an output signal Vo_k by amplifying the input signal Vi_k supplied via the transmission filter 24-$k$. Typically, the output amplifier 26-$k$ is a power amplifier, but the amplifier is not limited thereto. The output amplifier 26-$k$ has a protection circuit for protecting the output amplifier 26-$k$ against overcurrent. The protection circuit limits a supply of an output current flowing into the output amplifier 26-$k$ in a case where an allowable maximum output current is exceeded.

The impedance circuit 28-$k$ includes one or more reactance elements provided between the output amplifier 26-$k$ and the output terminal 29-$k$. A reactance varies depending on a frequency in the reactance element, which includes an element that has an inductive reactance and an element that has a capacitive reactance. The inductive reactance increases proportionate to a rise in frequency, and thus a ratio of an applied voltage to a current flow increases as the frequency rises. The capacitive reactance is inversely proportional to the frequency, and thus a ratio of an applied voltage to a current flow decreases as the frequency lowers. An inductor or a capacitor may be used as the reactance element.

A reactance of a reactance element is a value of an imaginary part within a complex impedance. The reactance is a ratio of a voltage to a current, and is measured in ohms. The impedance circuit 28-$k$ includes a reactance element and is characterized in that a value of impedance varies depending on a frequency of an applied signal. This is because the imaginary part of the complex impedance of the circuit includes a reactance resulting from inclusion of the reactance element in the circuit. In some cases a single reactance element only is included in the impedance circuit 28-$k$, whereas in other cases, multiple reactance elements are included in the circuit. For example, an inductor and a capacitor can be connected together and included in the impedance circuit 28-$k$.

Impedance between the input and the output of the impedance circuit 28-$k$ for frequencies that belong to the band Bk is smaller than impedance for frequencies that are outside the band Bk. Accordingly, the output signal Vo_k in the band Bk output from the output amplifier 26-$k$ is output to the transmission line 100 via the impedance circuit 28-$k$ with low impedance. The transmission filter 24-$k$ is used to pass frequency components of the band Bk and reduce other frequency components. Accordingly, there is no necessity to include the transmission filter 24-$k$ in a case that frequency components other than those that should be passed are not required to be reduced in the input signal Vi_k. That is, it is not necessary to include the transmission filter 24-$k$ in a case where all frequency components of the input signal Vi-k fall within the band Bk.

The reception device 40-$k$ is provided with a buffer circuit 44-$k$ that is connected to the transmission line 100, and a reception filter 46-$k$, and the reception device 40-$k$ outputs a reception signal Vr_k. The input impedance of the buffer circuit 44-$k$ is a high impedance, and is higher than the impedance of the transmission line 100 in the n bands B1 to Bn. The buffer circuit 44-$k$ amplifies a voltage of a signal received via the transmission line 100. In some embodiments, the buffer circuit 44-$k$ may amplify a current with a voltage gain of "1". The reception device 40-$k$ should receive a signal having frequency components belonging to the band Bk. Accordingly, the reception filter 46-$k$ passes frequency components for the band Bk and reduces frequency components outside the band Bk. With use of the reception filter 46-$k$, frequency components of the output signal Vo_k transmitted from the transmission device 20-$k$ are taken out, and from a resultant signal a reception signal Vr-K is generated. The reception filter 46-$k$ is used to pass frequency components of the band Bk and reduce the other frequency components. For this reason, the buffer circuit 44-$k$ need not be provided if frequency components other than those that should be passed are not required to be reduced in the signal input to the buffer circuit 44-$k$.

For transmission of a sound signal, as the transmission line 100 there can be used an audio cable, such as a speaker cable or a pin cable. However, the transmission line 100 is not limited thereto, and any cable may be used as long as it can appropriately transmit an electric signal.

In the above signal transmission system 10, in some cases the n transmission devices 20-1 to 20-$n$ simultaneously output the output signals Vo_1 to Vo_n to the transmission line 100. In the impedance circuits 28-1 to 28-$n$, an inductance or a capacitance of one or more reactance elements is designed such that, even if the output signals Vo_1 to Vo_n are simultaneously output to the transmission line 100, a current that flows into each of the output amplifiers 26-1 to 26-$n$ does not exceed a maximum output current of each output amplifier 26-1, 26-2, • • • or 26-$n$.

Figure 2:
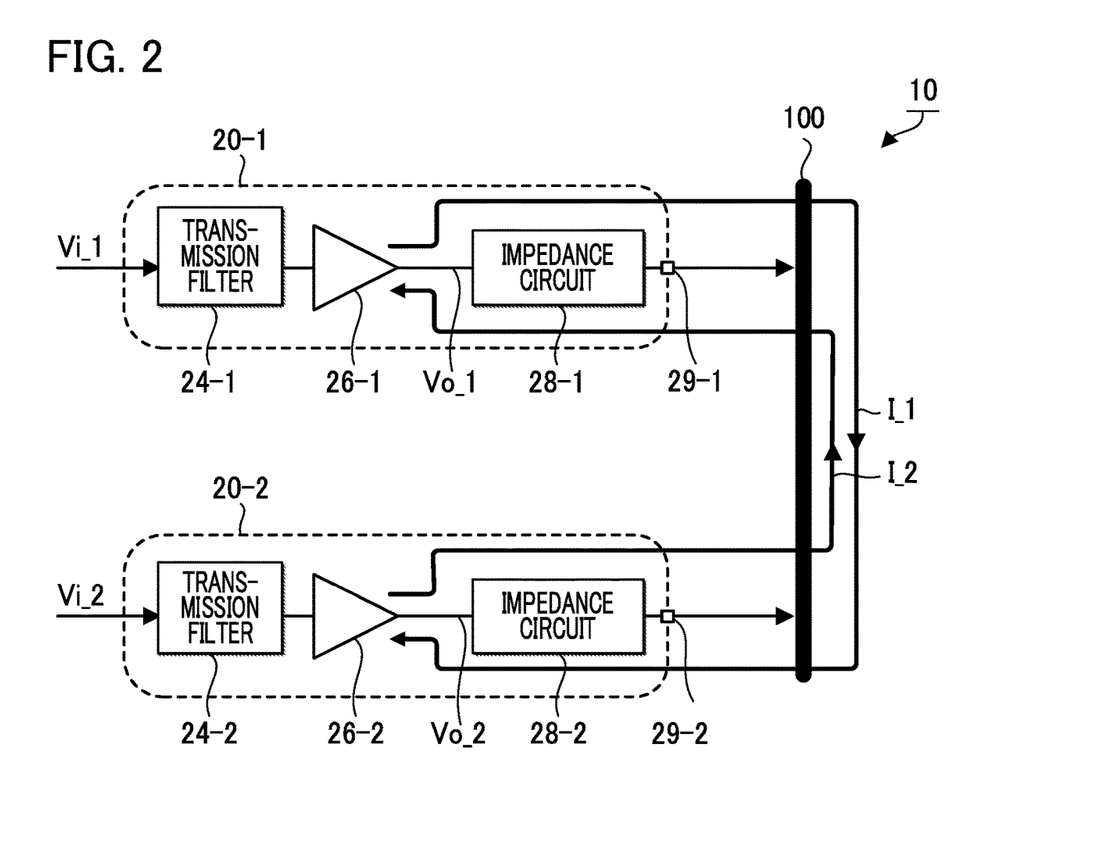
FIG. 2 is an explanatory diagram showing a flow of a current I_1 and a current I_2 between an output amplifier 26-1 and an output amplifier 26-2.

As an example, a case is assumed in which a transmission device 20-1 (an example of a first transmission device) outputs an output signal Vo_1, and a transmission device 20-$n$ (an example of a second transmission device) outputs an output signal Vo_n. As shown in FIG. 2, a current I_1 flows into the output amplifier 26-$n$ (an example of a second output amplifier) by passing through the output amplifier 26-1 (an example of a first output amplifier), the impedance circuit 28-1 (an example of a first impedance circuit), the transmission line 100, and then the impedance circuit 28-$n$ (an example of a second impedance circuit). Likewise, a current I_n flows into the output amplifier 26-1 by passing through the output amplifier 26-$n$, the impedance circuit 28-$n$, the transmission line 100, and the impedance circuit 28-1. If the impedance circuit 28-1 and the impedance circuit 28-$n$ were not provided, the output amplifier 26-1 and the output amplifier 26-$n$ would be directly connected to each other. In this case, the load of the output amplifier 26-1 and that of the output amplifier 26-$n$ would be at a low impedance, and a current exceeding the maximum output current would flow there through.

In contrast, in the present embodiment, impedance of the impedance circuit 28-$n$ is determined such that a value of a current flowing in the band B1 does not exceed the maximum output current value of the output amplifier 26-$n$; and impedance of the impedance circuit 28-1 is determined such that the value of a current flowing in the band Bn does not exceed the maximum output current value of the output amplifier 26-1.

Where impedance of the impedance circuit 28-1 is Z1; that of the impedance circuit 28-2 is Z2; and that of the transmission line 100 is Zx, and hence, impedance as seen from the output amplifier 26-1 to the output amplifier 26-2 and impedance as seen from the output amplifier 26-2 to the output amplifier 26-1 each will be Z1+Zx+Z2. Next is discussed a current I_2 that flows from the transmission device 20-2 to the transmission device 20-1. Here, the frequency components in the band B2 of the output signal Vo_2 of the transmission device 20-2 are large and the frequency components in the bands other than the band B2 are small. In other words, the output signal Vo_2 has most frequency components residing in the band B2. Accordingly, to handle flow of an overcurrent through the output amplifier 26-1, where such an overcurrent is caused by influx of the current I_2 into the amplifier 26-1, the frequency components in the band B2 should be controlled. The impedance circuit 28-2 is designed to have low impedance in the band B2, such that the output signal Vo_2 is output to the transmission line 100. Hence, Z1 is dominant among Z1, Zx, and Z2, which constitute impedance for the band B2 in the path from the output amplifier 26-2 to the output amplifier 26-1. Accordingly, the impedance Z1 of the impedance circuit 28-1 is determined such that a value of the current I_2 flowing in the band B2 is equal to or less than the maximum output current value of the output amplifier 26-1. In other words, by use of the impedance circuit 28-1, the current I_2 of the output signal Vo_2 flowing from the transmission line 100 into the impedance circuit 28-1, and then flowing out toward the output amplifier 26-1 takes a value that is equal to or less than the maximum output current value of the output amplifier 26-1.

Next is discussed a current I_1 that flows from the transmission device 20-1 into the transmission device 20-2. The frequency components in the band B1 of the output signal Vo_1 of the transmission device 20-1 are large, and the frequency components in bands other than the band B1 are small. Accordingly, to handle flow of overcurrent through the output amplifier 26-2, where such an overcurrent is caused by the influx of the current I_1 into the amplifier 26-2, the frequency components in the band B1 should be controlled. Z2 is dominant among Z1, Zx, and Z2, which constitute impedance for the band B1. Accordingly, the impedance Z2 of the impedance circuit 28-2 is determined such that a value of the current I_1 flowing in the band B1 is equal to or less than the maximum output current value of the output amplifier 26-2. In other words, reactance values of the one or more reactance elements constituting the impedance circuit 28-2 are determined such that the current I_1 flowing from the transmission line 100 into the impedance circuit 28-2, and then flowing out to the output amplifier 26-2 takes a value that is equal to or less than the maximum output current value of the output amplifier 26-2. By use of the impedance circuit 28-2, the current I_1 of the output signal Vo_1 flowing from the transmission line 100 into the impedance circuit 28-2, and then flowing out toward the output amplifier 26-2 takes a value that is equal to or less than the maximum output current value of the output amplifier 26-2. The foregoing discussion is not limited to a system having two transmission devices 20-1 and 20-2 only, but also applies to the signal transmission system 10 having n transmission devices 20-1 to 20-*n*.

The impedance circuit 28-1 is designed to have low impedance in the band B1 and to have high impedance in the band B2, and therefore, even if the current I_1 flows from the transmission device 20-2 toward the transmission device 20-1 in the band B2, no overcurrent flows into the output amplifier 26-1. Likewise, the impedance circuit 28-2 is designed to have low impedance in the band B2 and to have high impedance in the band B1; therefore, even if the current I_1 flows from the transmission device 20-1 toward the transmission device 20-2 in the band B1, no overcurrent flows into the output amplifier 26-2. Thus, in the signal transmission system 10, signals with different bands can be transmitted in both directions via the transmission line 100.

In the signal transmission system 10, the output signal Vo_1 corresponding to the band B1 has the lowest frequency components, and the output signal Vo_n corresponding to the band Bn has the highest frequency components among the output signals Vo_1 to Vo_n. Accordingly, an inductor may be adopted as a reactance element used for the impedance circuit 28-1 (an example of a first impedance circuit). Also, a capacitor may be adopted as a reactance element used for the impedance circuit 28-*n* (an example of a second impedance circuit). Moreover, an inductor and a capacitor that are connected in series may be adopted as reactance elements used for each of the impedance circuit 28-2 to 28-(*n*−1). When thus configured, the impedance circuit 28-1 serves as a low-pass filter; the impedance circuit 28-*n* serves as a high-pass filter; and the impedance circuits 28-2 to 28-(*n*−1) each serve as a band pass filter. The upper limit frequency of the band B1 (an example of a first band) is lower than the lower limit frequency of the band Bn (an example of a second band). The frequencies belonging to a band B3 (an example of a third band) are higher than the upper limit frequency of the band B1 and are lower than the lower limit frequency of the band Bn. The transmission device 20-3 (an example of a third transmission device) is provided with an output amplifier 26-3 (an example of a third output amplifier) that outputs the output signal Vo_3 (an example of a third output signal) and an impedance circuit 28-3 (an example of a third impedance circuit). The impedance circuit 28-3 has an inductor and a capacitor provided between the output amplifier 26-3 and the transmission line 100, and impedance corresponding to frequencies belonging to the band B3 is smaller than impedance corresponding to frequencies other than the band B3.

In the first embodiment, the number of transmission devices is the same as the number of reception devices, but this need not be the case. Where in is a natural number of one or more, the signal transmission system 10 may have n transmission devices and in reception devices. For example, the output signal Vo_k in the band Bk output from the transmission device 20-*k* may be received by multiple reception devices 40-*k*. In this case, there may be included in the output signal Vo_k an identification signal that identifies one of the reception devices 40-*k*. Each of the reception devices 40-*k* has a determiner that determines whether the identification signal is one assigned to each reception device. When the output signal Vo_k is received at the reception devices 40-*k*, each reception device 40-*k* outputs a reception signal Vr_k if a determination result of the determiner indicates that the identification signal is one assigned to the reception device 40-*k*, and does not output the reception signal Vr_k in a case where a determination result of the determiner indicates otherwise.

1-2. Example of the Signal Transmission System 10

Figure 3:
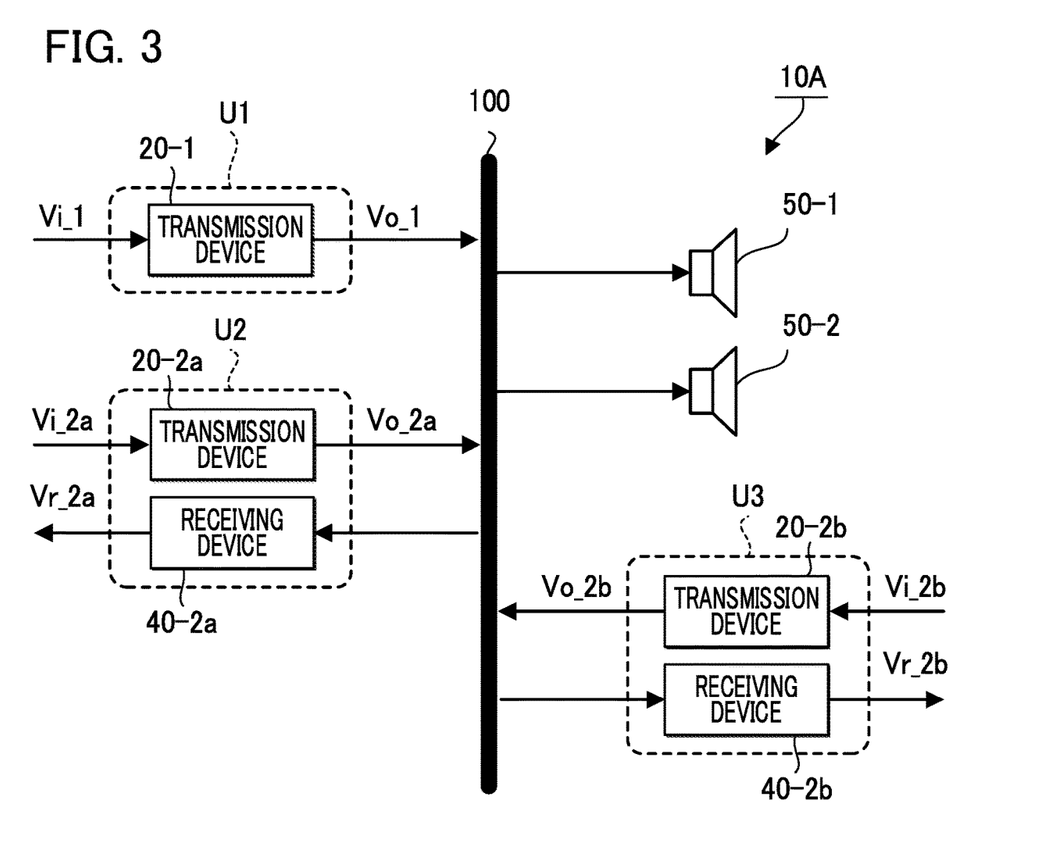
FIG. 3 is a block diagram showing an overall configuration of a signal transmission system 10A according to the first embodiment of the present disclosure.

A signal transmission system 10A that is an example of the signal transmission system 10 will now be described. In this example, signals are transmitted using the band B1 (an example of a first band) and the band Bn (an example of a second band). The lower limit frequency of the band B1 is 0 Hz; and the upper limit frequency of the band B1 is 8 kHz. The lower limit frequency of the band B2 is 18 kHz−(minus) 30 Hz, and the upper limit frequency of the band B2 is 18 kHz+30 Hz.

FIG. 3 is a block diagram showing an example configuration of the signal transmission system 10A. As shown in the figure, the signal transmission system 10A has communication units U1 to U3, speakers 50-1 and 50-2, and a transmission line 100. The transmission line 100 in this example is a twisted pair or a 2 core parallel speaker cable. The input impedances of the speaker 50-1 and 50-2 are high, and each takes a value of 10 kilo-ohm, for example.

The communication unit U1 sends the output signal Vo_1 to the transmission line 100. The output signal Vo_1 has more frequency components in the band B1 than frequency components in any band other than the band B1. The communication units U2 and U3 send output signals Vo_2a and Vo_2b to the transmission line 100. The output signals Vo_2a and Vo_2b each have more frequency components in the band B2 than frequency components in any band other than the band B2. The input signal Vi_1 input to the communication unit U1 is a sound signal having frequency components in the range from 20 Hz to 20 kHz. The input signals Vi_2a and Vi_2b respectively input to the communication units U2 and U3, are each a signal obtained by modulating an 18-kHz carrier signal with a corresponding data signal. Thus, in the signal transmission system 10A, data signals are multiplexed with sound signals when transmitted via a speaker cable (i.e., the transmission line 100) that transmits sound signals via the transmission line 100. The communication units U2 and U3 both communicate within the same band B2. Accordingly, to the transmission line 100, the communication unit U2 outputs the output signal Vo_2a; or the communication U3 outputs the output signal Vo_2b. In other words, the communication unit U3 does not output the output signal Vo_2b to the transmission line 100 while the communication unit U2 outputs the output signal Vo_2a to the transmission line 100; and the communication unit U2 does not output the output signal Vo_2a to the transmission line 100 while the communication unit U3 outputs the output signal Vo_2b to the transmission line 100. In this example, the communication unit U2 serves as a master device; and the communication unit U3 serves as a slave device.

The communication unit U1 is provided with the above-described transmission device 20-1. With the transmission filter 24-1 of the transmission device 20-1, the input signal Vi_1 is filtered to contain only frequency components of the band B1. The communication unit U2 has a transmission device 20-2a and a reception device 40-2a; the communication unit U3 has a transmission device 20-2b and a reception device 40-2b. The transmission devices 20-2a and 20-2b have identical configurations. The reception devices 40-2a and 40-2b have identical configurations, and an example of such a configuration is the reception device 40-2.

Figure 4:
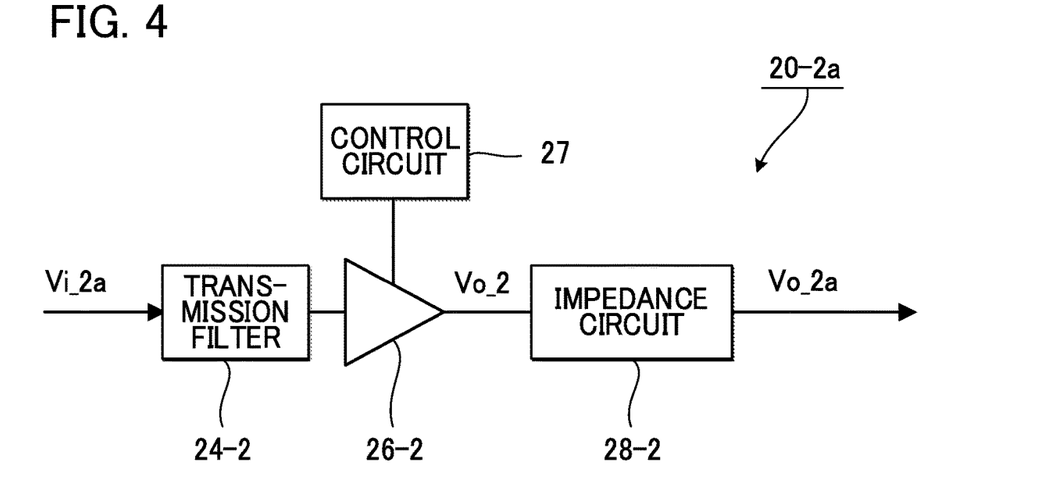
FIG. 4 is a block diagram showing a configuration of a transmission device 20-2a used for the signal transmission system 10A.

FIG. 4 is a block diagram showing a configuration of the transmission device 20-2a. In the figure, the same reference signs are used for the same elements as those of the transmission device 20-2 shown in FIG. 1, and description thereof will be omitted as appropriate. The transmission device 20-2a differs from the transmission device 20-2 in that the transmission device 20-2a has a control circuit 27. The control circuit 27 of the transmission device 20-2a causes the communication unit U2 to serve as a master device, and the control circuit 27 of the transmission device 20-2b causes the communication unit U3 to serve as a slave device.

The control circuit 27 controls the output of the output amplifier 26-2 to be in either a high impedance state or a low impedance state. When the output of the output amplifier 26-2 is controlled to be in the low impedance state, the output signal Vo_2a is output to the transmission line 100. When the output of the output amplifier 26-2 is controlled to be in the high impedance state, the output signal Vo_2a is not output to the transmission line 100.

During a period in which the control circuit 27 of the transmission device 20-2a, serving as a master device, controls the output of the output amplifier 26-2 to be in the low impedance state, the control circuit 27 of the transmission device 20-2b controls the output of the output amplifier 26-2 to be in the high impedance state. During a period in which the control circuit 27 of the transmission device 20-2b, serving as a slave device, controls the output of the output amplifier 26-2 to be in the low impedance state, the control circuit 27 of the transmission device 20-2a controls the output of the output amplifier 26-2 to be in the high impedance state.

Thus, the transmission device 20-2a outputs the output signal Vo_2a to the transmission line 100 during a period in which the transmission device 20-2b is not in a state of output of the output signal Vo_2b; and the transmission device 20-2b outputs the output signal Vo_2b to the transmission line 100 during a period in which the transmission device 20-2a is not in a state of output of the output signal Vo_2a. Therefore, in the band B2, a short circuit will not occur between the output amplifier 26-2 of the transmission device 20-2a and the output amplifier 26-2 of the transmission device 20-2b. It is of note that the transmission devices 20-2a and 20-2b each may be provided with a relay on the path from the output amplifier 26-2 to the output terminal 29-2, such that the control circuit 27 may control the relay to be in either an on state or an off state.

Supplied to each of the speaker 50-1 and 50-2 are the output signal Vo_1 in the band B1, and the output signal Vo_2a or Vo_2b in the band B2. In some cases, the speakers 50-1 and 50-2 may not be able to reproduce the output signal Vo_2a or Vo_2b in the band B2 at a sufficiently high level. Even if the speakers 50-1 and 50-2 are able to reproduce the output signal Vo_2a or Vo_2b that is in the band B2, the reproduced sounds will be barely audible to the human ear. Accordingly, sounds output from the speakers 50-1 and 50-2 are substantially those in the band B1.

The speakers 50-1 and 50-2 receive the output signals Vo_1 and Vo_2a or the output signals Vo_1 and Vo_2b. An input impedance of each speaker 50-1, 50-2 is 10 kilo-ohm, which is higher than the impedance of the transmission line 100. Each speaker 50-1, 50-2 thus serves as a reception device that is connected to the transmission line 100, and an input impedance of the reception device is higher than the impedance of the transmission line 100 in the band B1 and the band B2.

The impedance circuit 28-1 of the transmission device 20-1 is in the form of an inductor. The inductance of the inductor is 1 mH, for example. The impedance circuit 28-2 of each of the transmission devices 20-2a and 20-2b is in the form of a capacitor. The capacitance of the capacitor is 0.01 µF, for example.

As described in the foregoing, in the signal transmission system 10, the transmission device 20-1 has the output amplifier 26-1 (an example of a first output amplifier) that outputs the output signal Vo_1 (an example of a first output signal), and an impedance circuit 28-1 (an example of a first impedance circuit) that has one or a plurality of reactance elements provided between the output amplifier 26-1 and the transmission line 100. Impedance of the impedance circuit 28-1 corresponds to frequencies belonging to the band B1 (an example of a first band), and is smaller than impedance corresponding to frequencies outside the band B1 (i.e., frequencies belonging to any band other than the band B1). The transmission device 20-2 (an example of a second transmission device) has the output amplifier 26-2 (an example of a second output amplifier) that outputs the output signal Vo_2 (an example of a second output signal); and the impedance circuit 28-2 (an example of a second impedance circuit) that has one or a plurality of reactance elements provided between the output amplifier 26-2 and the transmission line 100. Impedance of the impedance circuit 28-2 corresponds to frequencies belonging to the band B2 (an example of a second band), which differs from band B1, and is smaller than impedance corresponding to frequencies outside the band B2 (i.e., frequencies belonging to any band other than the band B2). In the signal transmission system 10, in the band B1, a value of a current I_1 flowing from the output amplifier 26-1 to the output amplifier 26-2 is equal to or less than a maximum output current value of the output amplifier 26-2. In the band B2, a current I_2 flowing from the output amplifier 26-2 to the output amplifier 26-1 is equal to or less than a maximum output current value of the output amplifier 26-1.

Therefore, even if a current I_1 is transmitted from the transmission device 20-1 to the transmission device 20-2 in the band B1, an overcurrent will not flow into the output amplifier 26-2. Likewise, even if a current I_2 is transmitted from the transmission device 20-2 to the transmission device 20-1 in the band B2, an overcurrent will not flow into the output amplifier 26-1. Accordingly, by use of the signal transmission system 10, it is possible to transmit signals with different bands via the transmission line 100 dual-directionally.

The transmission device 20-1 (an example of a first transmission device) further has the transmission filter 24-1 (an example of a first transmission filter) to which the input signal Vi_1 (an example of a first input signal) is supplied that has frequency components belonging to a band that is wider than the band B1. The transmission filter 24-1 outputs the input signal Vi_1 after reducing frequency components that are outside the band B1, to the output amplifier 26-1. By use of the transmission filter 24-1, it is possible to reduce an influence of the input signal on a signal having frequency components outside the band B1.

The transmission device 20-2 (an example of a second transmission device) further has a transmission filter 24-2 (an example of a second transmission filter) to which an input signal Vi_2 (an example of a second input signal) is supplied that has frequency components in a band that is wider than the band B2. The transmission filter 24-2 outputs the input signal Vi_2 after reducing frequency components that are outside the band B2, to the output amplifier 26-2. By use of the transmission filter 24-2, it is possible to reduce an influence of the input signal on a signal having frequency components outside the band B2.

The signal transmission system 10 further has the speaker 50-1 (an example of a first reception device) connected to the transmission line 100, where in the band B1 and in the band B2 impedance of the speaker 50-1 is higher than that of the transmission line 100; and the reception device 40-2 (an example of a second reception device) connected to the transmission line 100, where in the band B1 and in the band B2 an input impedance of the reception device 40-2 is higher than that of the transmission line 100. According to this aspect, efficient reception is enabled for a signal transmitted from the transmission device 20-1 and the transmission device 20-2a (an example of a second transmission device).

The reception device 40-2 has the reception filter 46-2 (an example of a second reception filter) that passes frequency components of the band B2 and that reduces frequency components outside the band B2. The reception device 40-2, using the reception filter 46-2, extracts frequency components of the output signal Vo_2b (an example of a second output signal), to generate the reception signal Vr_2a (an example of a second reception signal) based on the extracted frequency components. As a result, noise is reduced in the output signal Vr_2b.

The reception device 40-1 (an example of a first reception device) has the reception filter 46-1 (an example of a first reception filter) that passes frequency components of the band B1 and reduces frequency components outside the band B1. The reception device 40-1, using the reception filter 46-1, extracts frequency components of the output signal Vo_1 (an example of a first output signal), to generate the reception signal Vr_1 (an example of a first reception signal) based on the extracted frequency components. As a result, noise is reduced in the output signal Vr_1.

The transmission device 20-2b (an example of a fourth transmission device) has the same configuration as that of the transmission device 20-2a as shown in FIG. 4. Accordingly, the transmission device 20-2b has the output amplifier 26-2 (an example of a fourth output amplifier) that outputs the output signal Vo_2 (an example of a fourth output signal); and the impedance circuit 28-2 (an example of a fourth impedance circuit) that has one or a plurality of reactance elements provided between the output amplifier 26-2 and the transmission line 100. Impedance of the impedance circuit 28-2 corresponds to frequencies belonging to the band B2, and is smaller than impedance corresponding to frequencies outside the band B2. As shown in FIG. 3, in the signal transmission system 10A, the transmission device 20-2a does not output the output signal Vo_2a while the transmission device 20-2b outputs the output signal Vo_2b, and the transmission device 20-2b does not output the output signal Vo_2b while the transmission device 20-2a outputs the output signal Vo_2a, via the transmission line 100. Since signals having frequency components in the same band are not simultaneously output to the transmission line 100, it is possible to prevent an overcurrent from flowing into the transmission device 20-2a and the transmission device 20-2b.

2. Second Embodiment

Figure 5:
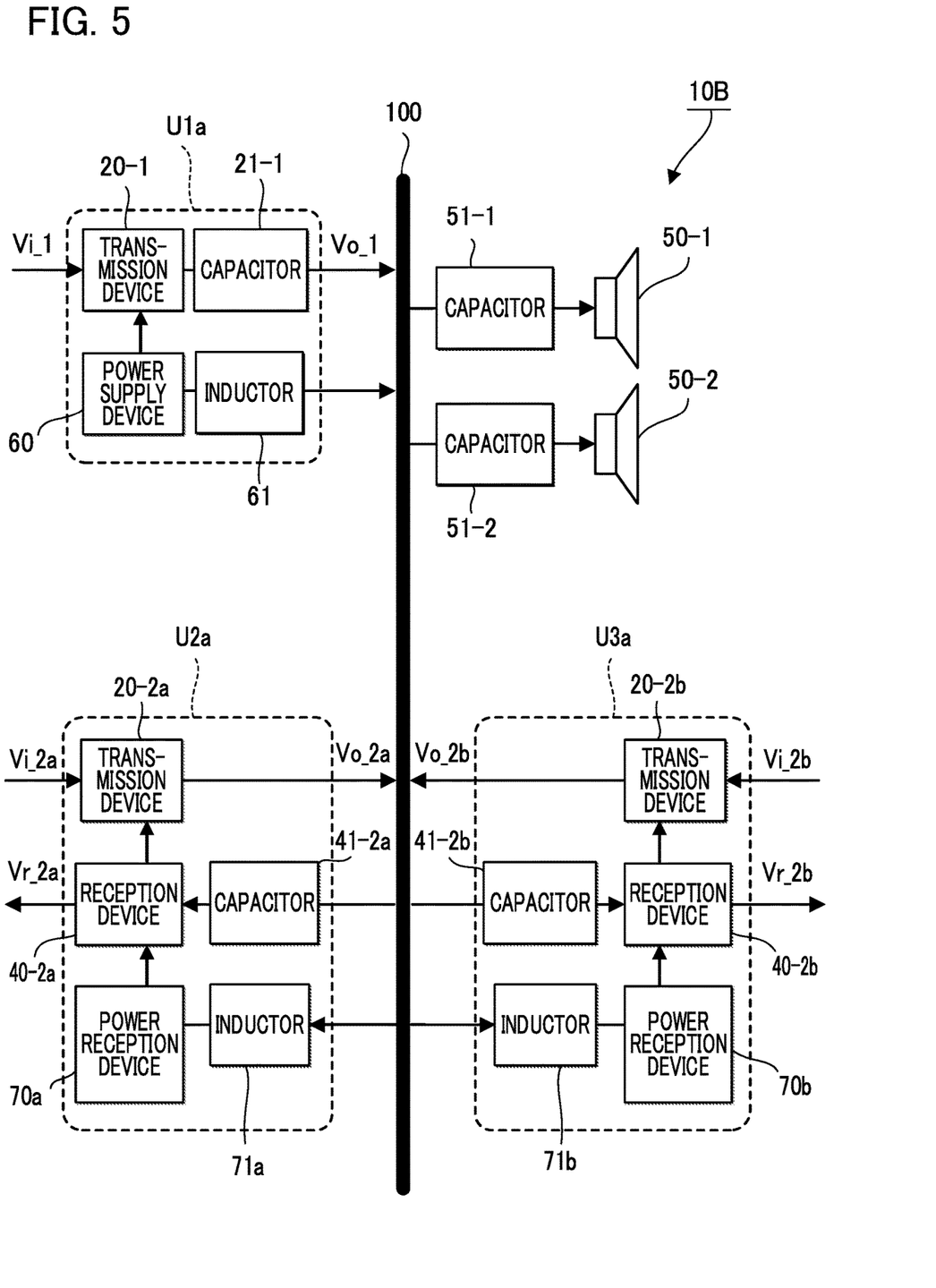
FIG. 5 is a block diagram showing an overall configuration of a signal transmission system 10B according to a second embodiment of the present disclosure.

In the first embodiment, the signal transmission systems 10 and 10A transmit signals via the transmission line 100. In contrast, in the second embodiment, the signal transmission system 10B transmits signals and power via the transmission line 100.

FIG. 5 is a block diagram showing a configuration of a signal transmission system 10B according to the second embodiment. In the figure, the same reference signs are used for the same elements as those shown in FIG. 4, and description thereof is omitted as appropriate. In the signal transmission system 10B, a direct current voltage is generated at a power supply device 60 that is provided in a communication unit U1a. The direct current voltage is then supplied, via a transmission line 100, to a power reception device 70a provided in a communication unit U2a and to a power reception device 70b provided in a communication unit U3a.

The communication unit U1a has the same configuration as that of the communication unit U1 as shown in FIG. 4, except that the communication unit U1a has a capacitor 21-1, the power-supply device 60, and an inductor 61. The power-supply device 60 supplies the power supply voltage to the transmission device 20-1 in the form of a direct current voltage. The power-supply device 60 is connected via the inductor 61 to the transmission line 100. An inductance of the inductor 61 is designed such that the power supply device 60 does not work as a load for the transmission devices 20-1, 20-2a, and 20-2b. The inductance of the inductor 61 is 100 mH, for example.

The capacitor 21-1 is provided between the transmission device 20-1 and the transmission line 100. The capacitor 21-1 prevents a direct current voltage from being applied to the output amplifier 26-1 (see FIG. 1). It is of note that the capacitor 21-1 may be omitted in a case where a capacitor is contained in the form of a reactance element of the impedance circuit 28-1 for the transmission device 20-1. The capacitance of the capacitor 21-1 is 100 µF, for example.

Between the speaker 50-1 and the transmission line 100 there is provided a capacitor 51-1, and between the speaker 50-2 and the transmission line 100 there is provided a capacitor 51-2. The capacitor 51-1 and the capacitor 51-2 prevent a direct current voltage from being applied to the speaker 50-1 and the speaker 50-2, respectively, even if a direct current voltage is added to other signals transmitted via the transmission line 100.

The communication unit U2a has the same configuration as that of the communication unit U2, except that the communication unit U2a has a capacitor 41-2a, an inductor 71a, and a power reception device 70a. Between the reception device 40-2a and the transmission line 100 there is provided a capacitor 41-2a. The capacitor 21-2a prevents a direct current voltage from being applied to the reception device 40-2a. It is of note that the impedance circuit 28-2 of the transmission device 20-2a contains a capacitor, and therefore, a direct current voltage is not applied to the output amplifier 26-2.

The power reception device 70a is connected via the inductor 71a to the transmission line 100. An inductance of the inductor 71a is designed such that the power reception device 70a does not work as a load for the transmission devices 20-1, 20-2a, and 20-2b. The inductance of the inductor 71a is 100 mH, for example. The power reception device 70 serves as a power supply circuit for the communication unit U2a, to supply a power supply voltage to the reception device 40-2a and the transmission device 20-2a.

The communication unit U3a has the same configuration as that of the communication unit U3, except that the communication unit U3a has a capacitor 41-2b, an inductor 71b, and a power reception device 70b. Provided between the reception device 40-2b and the transmission line 100 is the capacitor 41-2b. The capacitor 21-2b prevents a direct current voltage from being applied to the reception device 40-2b. It is of note that the impedance circuit 28-2 of the transmission device 20-2b contains a capacitor, and therefore, a direct current voltage is not applied to the output amplifier 26-2.

The power reception device 70b is connected via the inductor 71b to the transmission line 100. An inductance of the inductor 71b is designed such that the power reception device 70b does not work as a load for the transmission device 20-1, 20-2a, and 20-2b. An inductance of the inductor 71b is 100 mH, for example. The power reception device 70b serves as a power supply circuit for the communication unit U3a, to supply a power supply voltage to the reception device 40-2b and the transmission device 20-2b.

In the signal transmission system 10B the power supply device 60 is connected to the transmission line 100 via the inductor 61 and supplies a direct current voltage; and the power reception device 70a is connected to the transmission line 100 via an inductor and receives the direct current voltage. The impedance circuit 28-1 (an example of a first impedance circuit) of the transmission device 20-2a includes a capacitor that is connected in series between the output amplifier (an example of a first output amplifier) and the transmission line 100. The impedance circuit 28-1 (an example of a second impedance circuit) of the transmission device 20-2b includes a capacitor that is connected in series between an output amplifier (an example of a second output amplifier) and the transmission line 100. Accordingly, a direct current voltage is not applied to the output of the output amplifier.

According to the signal transmission system 10B, the transmission line 100 can be used to transmit a direct current voltage, and therefore, it is not necessary to provide a power supply circuit at the communication units U2a and U3a. As a result, the configuration can be simplified.

3. Application Example

Figure 6:
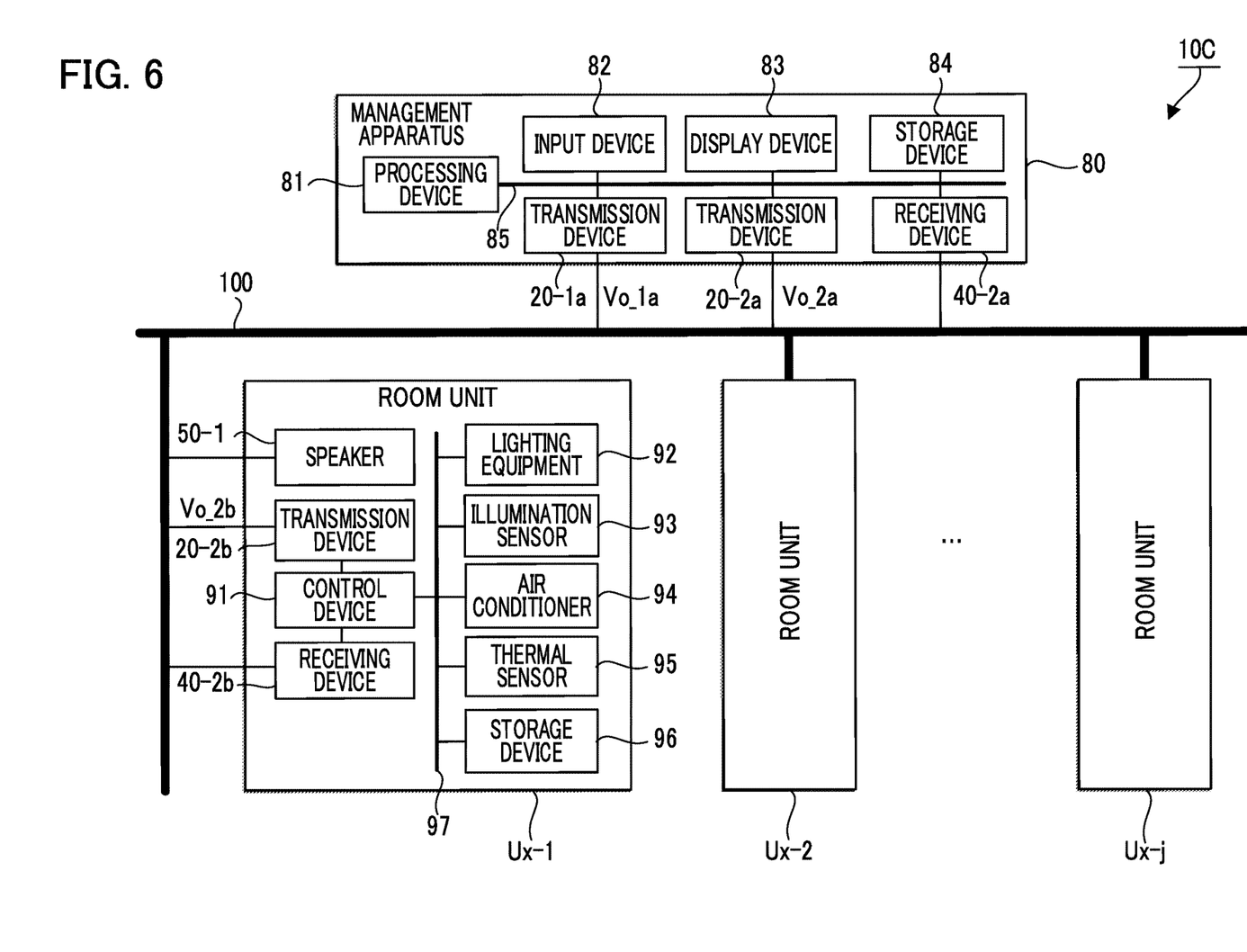
FIG. 6 is a block diagram showing an overall configuration of a meeting room management system 10C according to an application example of the present disclosure.

A meeting room management system 10C will now be described as an application of the signal transmission system 10. FIG. 6 is a block diagram showing an overall configuration of a meeting room management system 10C. The meeting room management system 10C centrally manages temperature and lighting for multiple meeting rooms and provides sound broadcast to the multiple meeting rooms.

As shown in FIG. 6, the meeting room management system 10C has a management apparatus 80, j room units Ux-1 to Ux-j, and a transmission line 100, where j is a natural number that takes a value of one or more. In this example, each of the j meeting rooms is provided with a corresponding one of the room units Ux-1 to Ux-j. The room units Ux-1 to Ux-j have identical configurations. A speaker cable is used as the transmission line 100. It is of note that the same reference signs are used for the same elements as those in the signal transmission system 10A shown in FIG. 3, and description thereof is omitted as appropriate.

The management apparatus 80 has transmission devices 20-1a and 20-2a, a reception device 40-2a, a processing device 81, an input device 82, a display device 83, a storage device 84, and a bus 85. The transmission device 20-1a outputs an output signal Vo_1 that has most frequency components in the band B1 to the transmission line 100. A lower limit frequency of the band B1 is 0 Hz, and an upper limit frequency of the band B1 is 8 kHz. The transmission device 20-2a outputs an output signal Vo_2 that has most frequency components in the band B2 to the transmission line 100. A lower limit frequency of the band B2 is 18 kHz−(minus) 30 Hz, and an upper limit frequency of the band B2 is 18 kHz+30 Hz. The output signal Vo_1 is a sound signal, and the output signal Vo_2 is a data signal.

The processing device 81 is a processor that controls the entire management apparatus 80. The processing device 81 is comprised of an interface with peripheral devices, and a CPU (Central Processing Unit) that includes a computing device and a resistor, etc., for example.

The storage device 84 is a recording medium that is readable by the processing device 81, and stores a management program executed by the processing device 81 and a variety of data used by the processing device 81. The storage device 84 includes one or more of various types of storage memory circuits, such as for example, a ROM (Read Only Memory), an EPROM (Erasable Programmable ROM), an EEPROM (Electrically Erasable Programmable ROM), and a RAM (Random Access Memory).

The input device 82 is equipment for receiving input of different types of information, and is a keyboard and a microphone, for example. A user of the management system uses a keyboard to enter meeting room schedules or uses a microphone to input a voice for an emergency announcement, for example. Information entered using the input device 82 is output to the processing device 81. The display device 83 displays different images under control of the processing device 81.

The processing device 81 executes the management program to control an environment of each meeting room in accordance with entries for meeting room schedules input in advance by the user. For example, the management apparatus 80 starts monitoring the temperature of a meeting room before the start of the scheduled usage time and controls the air conditioner 94 of the meeting room such that the temperature inside the room is appropriate during the scheduled usage time. The management apparatus 80 also monitors illumination in the meeting room, and turns off the lighting equipment 92 of the room in a case where the illumination is high even after the scheduled usage time is over. Moreover, the processing device 81 outputs a sound signal indicative of an emergency announcement voice via the transmission device 20-1a to the transmission line 100.

The room unit Ux-1 has a speaker 50-1, a transmission device 20-2b, a reception device 40-2b, a control device 91, lighting equipment 92, an illumination sensor 93, an air conditioner 94, a thermal sensor 95, a storage device 96, and a bus 97. The transmission device 20-2b outputs an output signal Vo_2b that has most frequency components in the band B2 to the transmission line 100. The output signal Vo_2b is a data signal that has most frequency components in the band B2. The reception device 40-2b receives a data signal that has most frequency components in the band B2. Supplied to the speaker 50-1 via the transmission line 100 is a signal in which the sound signal and the data signal are multiplexed. Since the data signal among the supplied signal has frequency components in the band B2, the sound components of the data signal contained in the sound output from the speaker 50-1 are barely audible to the human ear. Accordingly, recognizable to the human ear from among sound output from the speaker 50-1 is sound based on the sound signal.

The control device 91 is a processor that controls the entire room unit Ux-1. The control device 91 is comprised of, for example, an interface with peripheral devices, and a CPU (Central Processing Unit) that includes a computing device and a resistor, etc., for example.

The storage device 96 is a recording medium readable by the control device 91, and stores a management program executed by the control device 91 and a variety of data used by control device 91. The storage device 96 includes one or more of various types of storage memory circuits, such as for example, a ROM, an EPROM, an EEPROM, and a RAM.

The lighting equipment 92 includes a light emitting device, such as fluorescent lamps, and, under control of the control device 91, the lighting equipment 92 turns the light emitting device on or off. The illumination sensor 93 measures an illumination of the meeting room. The air conditioner 94, under control of the control device 91, turns on the cooling or turns on the heating. The thermal sensor 95 measures a temperature of the meeting room.

The control device 91 obtains the data signal transmitted from the transmission device 20-2a of the management apparatus 80 via the reception device 40-2b for control of the lighting equipment 92 and the air conditioner 94 in accordance with commands contained in the data signal. The control device 91 transmits illumination data and temperature data via the transmission device 20-2b to the management apparatus 80 in accordance with the commands contained in the data signal, where the illumination data is indicative of illumination detected by the illumination sensor 93 and the temperature data is indicative of temperatures detected by the thermal sensor 95.

Thus, the management apparatus 80 serves as a master device, and each of the room units Ux-1 to Ux-j serves as a slave device. According to the meeting room management system 10C, data signals using different bands can be transmitted dual-directionally via the speaker cable that supplies sound signals to the speaker 50-1 installed in each meeting room.

The power supply device 60 and the power reception device 70a described in the second embodiment may be applied to the meeting room management system 10C. In this case, the management apparatus 80 may be provided with the power supply device 60, and each of the room units Ux-1 to Ux-j may be provided with the power reception device 70a. Furthermore, a speaker unit in which the speaker 50-1 is accommodated may be provided with each of the power reception device 70a, the transmission device 20-2b, the reception device 40-2b, the illumination sensor 93, the thermal sensor 95, the storage device 96, and the bus 97. The speaker unit may then be connected to the lighting equipment 92 by way of a first wiring, and the speaker unit may then be connected to the air conditioner 94 by way of a second wiring. According to this configuration, the meeting room management system 10C can be readily configured by providing each meeting room with a speaker unit and connecting each speaker unit to the management apparatus 80 by way of a speaker cable. Moreover, it is not necessary to provide a separate power supply circuit for each room unit, for supply of power to each of the elements contained in the speaker unit.

4. Modifications

The present disclosure is not limited to the embodiments described above. Specific modes of the modifications will now be given in the following. Two or more of the following modifications may be freely selected and combined.

In the above-described embodiments, a speaker cable is given as an example of the transmission line 100. In some embodiments, the transmission line 100 may be a line cable for connecting audio equipment. For example, a preamplifier and a main amplifier may be connected by use of a line cable. With such a configuration, a line cable may be used to transmit a sound signal and a data signal at a line level, with the sound signal and the data signal being multiplexed (added together). The line level is a level of a signal that is transmitted between different audio equipment using a line cable. The line level is determined based on specifications of audio equipment or on a standard for signal transmission between the audio equipment. According to this configuration, data signals with different bands can be transmitted between a preamplifier and a main amplifier via a line cable dual-directionally.

The transmission device 20-2 (an example of a transmission device) used for the signal transmission system 10A described in the above embodiment is connected to the transmission line 100, to which the output signal Vo_1 (an example of a first output signal) is supplied, that has more frequency components in the band B1 (an example of a first band) than frequency components outside the band B1. The transmission device 20-2 has the output amplifier 26-2 (an example of an output amplifier) that outputs the output signal Vo_2 (an example of a second output signal); and the impedance circuit 28-2 (an example of an impedance circuit) that has one or a plurality of reactance elements provided between the output amplifier 26-2 and the transmission line 100, and impedance of the impedance circuit 28-1 corresponds to frequencies belonging to the band B2 (an example of a second band) and is smaller than impedance corresponding to frequencies outside the band B2. Accordingly, frequency components outside the band B2 can be reduced, and therefore, it is possible to prevent an overcurrent from flowing into the output amplifier 26-2 even if a current flows from another transmission device 20-1 into the transmission device 20-2. The transmission device 20-2 (an example of a transmission device) may additionally have the transmission filter 24-2 (an example of a transmission filter), to which an input signal Vi_2 (an example of an input signal) having frequency components in a band that is wider than the band B2 is supplied, and the transmission filter 24-2 reduces frequency components outside the band B2 of the input signal Vi_2, to output a resultant signal to the output amplifier 26-2. With use of the transmission filter 24-2, it is possible to reduce the influence of the input signal on a signal having frequency components outside the band B2.

DESCRIPTION OF REFERENCE SIGNS 10,10A,10B . . . signal transmission system, 20-1 to 20-n . . . transmission device, 24-K . . . transmission filter, 26-K . . . output amplifier, 28-1 to 28-N . . . impedance circuit, 29-K . . . output terminal, 40-K . . . reception device, 46-1 . . . reception filter, 50-1 . . . speaker, 60 . . . power supply device, 70 . . . power reception device.

What is claimed is:

1. A signal transmission system, comprising:
    a first transmission device that includes:
        a first output amplifier configured to output a first output signal; and
        a first impedance circuit that has one or a plurality of reactance elements provided between the first output amplifier and a transmission line, where impedance of the first impedance circuit corresponds to frequencies belonging to a first band and is smaller than impedance corresponding to frequencies outside the first band; and
    a second transmission device that includes:
        a second output amplifier configured to output a second output signal; and
        a second impedance circuit that has one or a plurality of reactance elements provided between the second output amplifier and the transmission line, where impedance of the second impedance circuit corresponds to frequencies belonging to a second band differing from the first band and is smaller than impedance corresponding to frequencies outside the second band,
    wherein
        in the first band, a value of a current flowing from the first output amplifier to the second output amplifier is equal to or less than a maximum output current value of the second output amplifier, and
        in the second band, a value of a current flowing from the second output amplifier to the first output amplifier is equal to or less than a maximum output current value of the first output amplifier.

2. The signal transmission system according to claim 1, wherein
    the first transmission device includes a first transmission filter configured to receive a first input signal that has frequency components belonging to a band that is wider than the first band, and configured to output to the first output amplifier the first input signal after reducing frequency components of the first input signal that are outside the first band.

3. The signal transmission system according to claim 2, wherein
    the second transmission device includes a second transmission filter configured to receive a second input signal that has frequency components belonging to a band that is wider than the second band, and configured to output to the second output amplifier the second input signal after reducing frequency components of the second input signal that are outside the second band.

4. The signal transmission system according to claim 1, further comprising:
    a first reception device that is connected to the transmission line, where an input impedance of the first reception device is higher than impedance of the transmission line in the first band and the second band; and
    a second reception device that is connected to the transmission line, where an input impedance of the second reception device is higher than impedance of the transmission line in the first band and the second band.

5. The signal transmission system according to claim 4, wherein
    the second reception device includes a second reception filter configured to pass frequency components of the second band, and configured to reduce frequency components outside the second band, and
    the second reception device, using the second reception filter, is configured to extract frequency components of the second output signal, and configured to generate a second reception signal based on the extracted frequency components.

6. The signal transmission system according to claim 5, wherein
    the first reception device includes a first reception filter configured to pass frequency components of the first band, and configured to reduce frequency components outside the first band, and
    the first reception device, using the first reception filter, is configured to extract frequency components of the first output signal, and configured to generate a first reception signal based on the extracted frequency components.

7. The signal transmission system according to claim 4, wherein
    the first output signal is a sound signal,
    the first reception device is a speaker, and
    the transmission line is a speaker cable configured to supply the first output signal to the speaker.

8. The signal transmission system according to claim 4, wherein
    the transmission line is a line cable, and
    the first transmission device is configured to output the first output signal of a line level to the transmission line.

9. The signal transmission system according to claim 1, wherein
    an upper limit frequency of the first band is lower than a lower limit frequency of the second band,
    the one or a plurality of reactance elements used for the first impedance circuit is an inductor, and
    the one or a plurality of reactance elements used for the second impedance circuit is a capacitor.

10. The signal transmission system according to claim 9, further comprising:
a third transmission device, the third transmission device including
a third output amplifier configured to output a third output signal; and
a third impedance circuit that has an inductor and a capacitor provided between the third output amplifier and the transmission line, where impedance of the third impedance circuit corresponds to frequencies belonging to a third band and is smaller than impedance corresponding to frequencies outside the third band, the third band being higher than the upper limit frequency of the first band and lower than the lower limit frequency of the second band.

11. The signal transmission system according to claim 1, further comprising:
a fourth transmission device, the fourth transmission device including
a fourth output amplifier configured to output a fourth output signal; and
a fourth impedance circuit that has one or a plurality of reactance elements provided between the fourth output amplifier and the transmission line, where impedance of the fourth impedance circuit corresponds to frequencies belonging to the second band and is smaller than impedance corresponding to frequencies outside the second band,
wherein the fourth transmission device does not output the fourth output signal to the transmission line while the second transmission device outputs the second output signal to the transmission line, and the second transmission device does not output the second output signal to the transmission line while the fourth transmission device outputs the fourth output signal to the transmission line.

12. The signal transmission system according to claim 1, further comprising:
a power supply device that is connected to the transmission line via an inductor and is configured to supply a direct current voltage; and
a power reception device that is connected to the transmission line via an inductor and is configured to receive the direct current voltage,
wherein
the first impedance circuit includes a capacitor that is connected in series between the first output amplifier and the transmission line, and
the second impedance circuit includes a capacitor that is connected in series between the second output amplifier and the transmission line.

13. A transmission device connectable to a transmission line which receives a first output signal that has more frequency components in a first band than frequency components outside the first band, the transmission device comprising:
an output amplifier configured to output a second output signal; and an impedance circuit that is provided between the output amplifier and the transmission line, where impedance of the impedance circuit corresponds to frequencies belonging to a second band differing from the first band and is smaller than impedance corresponding to frequencies belonging to the first band,
wherein the impedance circuit is configured to make a value of a current of the first output signal from the transmission line to the output amplifier equal to or less than a maximum output current value of the output amplifier.

14. The signal transmission system according to claim 13, wherein
the impedance circuit has one or a plurality of reactance elements that are connected between the output amplifier and the transmission line.

15. The transmission device according to claim 13, further comprising:
a transmission filter configured to receive an input signal that has frequency components in a band that is wider than the second band, where the transmission filter is configured to output to the output amplifier the input signal with reduced frequency components outside the second band of the input signal.

16. A communication unit comprising:
the transmission device according to claim 13; and
a reception device that is connected to the transmission line, where an input impedance of the reception device is higher than impedance of the transmission line in the first band and the second band.

17. The communication unit according to claim 16, wherein
the reception device includes a reception filter configured to pass frequency components of the second band and configured to reduce frequency components outside the second band, and
the reception device, using the reception filter, is configured to extract frequency components of the second output signal, and configured to generate a reception signal based on the extracted frequency components.

18. The communication unit according to claim 16, further comprising:
a power reception device that is connected to the transmission line via an inductor, the power reception device being configured to receive supply of direct current voltage from a power supply device connected via an inductor and configured to supply power to the transmission device,
wherein the impedance circuit includes a capacitor that is connected in series between the output amplifier and the transmission line.

* * * * *